United States Patent [19]

Leprince et al.

[11] Patent Number: 5,063,330
[45] Date of Patent: Nov. 5, 1991

[54] PLASMA REACTOR

[75] Inventors: Philippe Leprince, Gif-sur-Yvette; Patrick Chollet, Les Ulis; Serge Saada, Kremlin-Bicetre, all of France

[73] Assignee: Centre National De La Recherche Scientifique, Paris, France

[21] Appl. No.: 601,818

[22] PCT Filed: May 9, 1989

[86] PCT No.: PCT/FR89/00225
§ 371 Date: Jan. 7, 1991
§ 102(e) Date: Jan. 7, 1991

[87] PCT Pub. No.: WO89/11206
PCT Pub. Date: Nov. 16, 1989

[30] Foreign Application Priority Data

May 9, 1988 [FR] France ................................ 88 06233

[51] Int. Cl.$^5$ .............................................. H05H 1/24
[52] U.S. Cl. ............................ 315/111.21; 313/231.31
[58] Field of Search ...................... 315/111.21, 111.41, 315/111.71, 111.81; 313/231.31

[56] References Cited

U.S. PATENT DOCUMENTS

| | | | |
|---|---|---|---|
| 3,814,983 | 6/1974 | Weissfloch et al. | 315/111.21 X |
| 4,859,909 | 8/1989 | Gualandris et al. | 315/111.81 |
| 4,866,346 | 9/1989 | Giaudreau et al. | 315/111.21 |
| 4,970,435 | 11/1990 | Tanaka et al. | 315/111.21 |
| 4,987,346 | 1/1991 | Katzschner et al. | 315/111.21 X |
| 5,003,225 | 3/1991 | Daudl | 315/111.71 X |

Primary Examiner—Eugene R. LaRoche
Assistant Examiner—Do H. Yoo
Attorney, Agent, or Firm—Pollock, Vande Sande & Priddy

[57] ABSTRACT

The invention relates to a plasma reactor including a housing which receives a selected gas flow, a microwave generator, and waveguide means to supply the microwaves to the housing according to a non-resonant coupling wherein the housing does not dissipate in the form of electromagnetic radition the ultrahigh frequence energy which is imparted to the housing in the presence of gas. According to a general definition of the invention, the housing being of a large size, the terminal portion of the waveguide means is progressively reduced in one direction and widened in the other direction till it reaches a flat rectangular cross-section surrounding completely the housing, and it forms a non-resonant coupling with the housing.

15 Claims, 4 Drawing Sheets

PLASMA REACTOR

BACKGROUND OF THE INVENTION

The invention relates to plasma reactors. It finds an application in the surface treatment of samples, in particular, in micro-electronics.

Plasma reactors are already known that comprise a housing placed in a vacuum capable of receiving a selected gas flow, a microwave generator and wave guide means for passing the microwaves to the housing.

To render the plasma homogeneous with a view to obtaining a better surface treatment of samples for example, provision is most frequently made for applying a magnetic diffusion field in the housing.

Now the application of such a magnetic diffusion field has the drawback that it consumes a large amount of energy, sometimes exceeding that used to produce the plasma.

The result is a limitation of the reactor dimensions and therefore of the dimensions of the plasma obtained, which prevents the treatment of samples with large diameters.

SUMMARY OF THE INVENTION

The object of the invention is to provide a solution of this problem.

More particularly, it aims to improve the flexibility of use of the plasma reactor and its versatility in application.

The invention relates to a plasma reactor comprising: a housing capable of receiving a selected gaseous flow, a microwave generator and wave guide means for passing the microwave to the housing along a non-resonant coupling wherein the housing does not dissipate, in the form of electromagnetic radiation, the ultrahigh frequency energy imparted thereto in the presence of gas.

According to a general definition of the invention, since the housing is of a large size, the end portion of the wave guide means is progressively reduced in one direction and widened in the other, until it reaches a flat rectangular cross section completely surrounding the said housing and produces a non-resonant coupling therewith.

According to one aspect of the invention, provision is made for a piston type ultrahigh frequency short circuit means, completely surrounded by the end portion of the wave guide means and disposed on the diametrically opposite side relative to the microwave intake, the said piston being adjusted so as to define a desired ultrahigh frequency electric field in the housing.

In the field of industrial applications of the plasma reactor in accordance with the invention, the ultrahigh frequency short circuit means is advantageously immovable.

In the field of experimental applications of the plasma reactor in accordance with the invention, the ultrahigh frequency short circuit means is preferably movable.

According to a preferred mode of embodiment of the invention, the housing comprises an internal tubular element placed in a vacuum and being concentric with the housing, the wall of the said tubular element being constituted by a material having low dielectric losses, such as quartz.

According to another characteristic of the invention, provision is made inside the housing for an additional ultrahigh frequency short circuit means coupled with the tubular element and having a first and second annular disc surrounding the said tubular element, the annular discs being separated from each other by a predetermined and adjustable distance with a view to confining the plasma in the portion of the tubular element comprised between the said annular discs.

In the field of industrial applications of the plasma reactor in accordance with the invention, the additional ultrahigh frequency short circuit means is immovable.

In the field of experimental applications of the plasma reactor in accordance with the invention, the additional ultrahigh frequency short circuit means is movable.

According to another aspect of the invention, the wave guide comprises in its intermediate portion, adjustment means such as a plurality of adjustable penetrating screws.

As a variant, the wave guide comprises in its intermediate end portion tapering in one direction and widened in the other, adjustment means such a plurality of adjustable penetrating screws.

In the sphere of a plasma reactor intended for the surface treatment of a sample, the sample rests on a sample carrier placed inside the tubular element and in the portion of the tubular element comprised between the annular discs of the additional ultrahigh frequency short circuit means.

According to another preferred mode of embodiment of the invention, the sample carrier is placed into the tubular element and outside the portion comprised between the annular discs of the additional ultrahigh frequency short circuit means.

In the field of applications to the engraving of substrates and/or resin removal, the plasma reactor comprises moreover means for generating an electromagnetic field between the delivery means of the gaseous flow and the sample carrier with a view to polarizing the sample.

Advantageously the plasma reactor comprises, moreover, heating means for the heating of the samples.

According to another characteristic of the invention, provision is made for a lock chamber for the insertion of the samples to allow the sample to be placed on the sample carrier.

BRIEF DESCRIPTION OF THE DRAWINGS

Other characteristics and advantages of the invention will become apparent on examining the detailed description given below, as well as the drawings wherein.

DETAILED DESCRIPTION OF THE PREFERRED EMBODIMENTS

The attached drawings comprise many elements of a definite nature which can only be provided by the drawings. They therefore form an integral part of the description to help with the understanding of the invention, as well as to define it.

Figure 1:
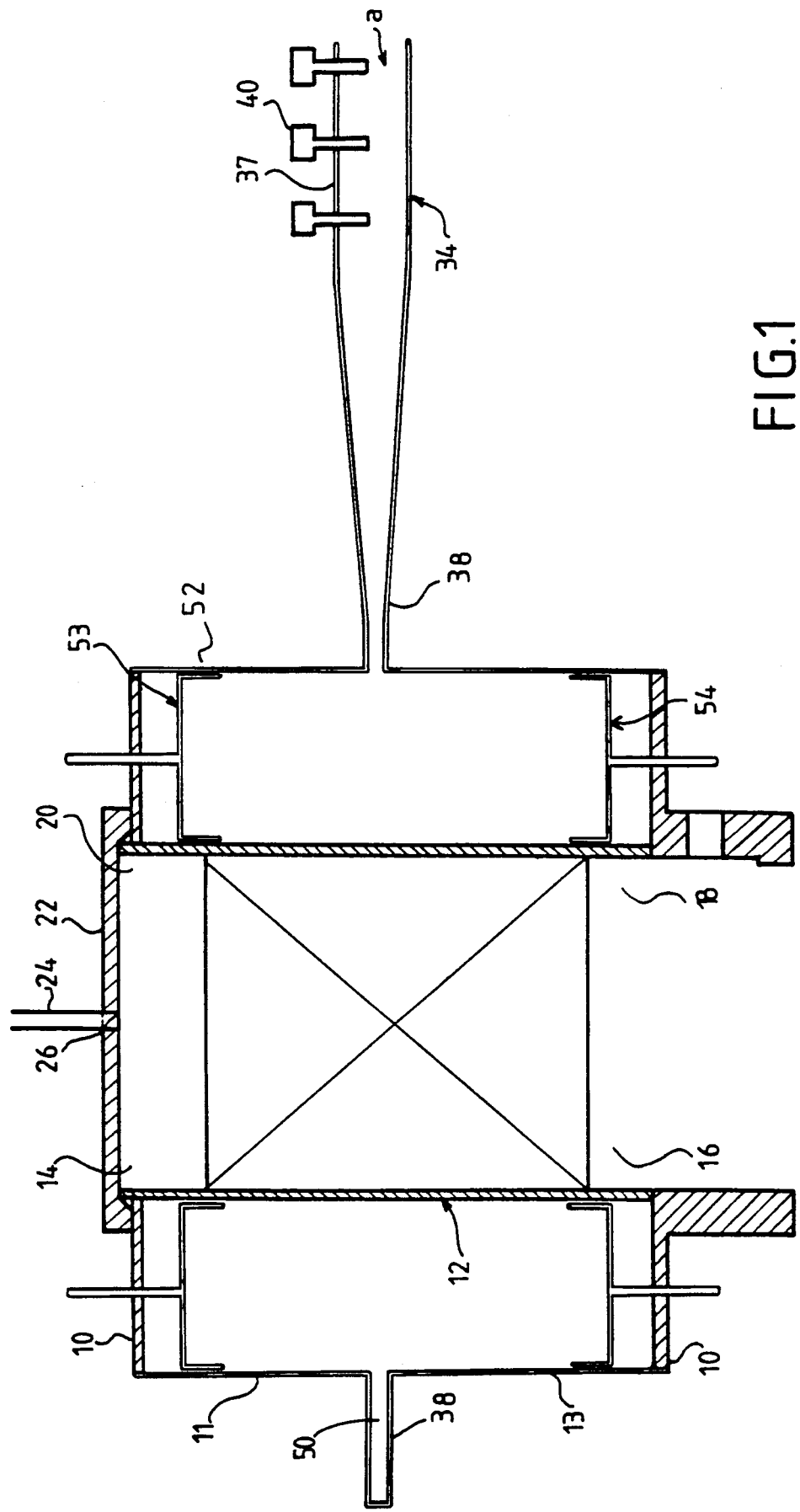
FIG. 1 is a schematic cross sectional view of the plasma reactor in accordance with the invention.
Figure 2:
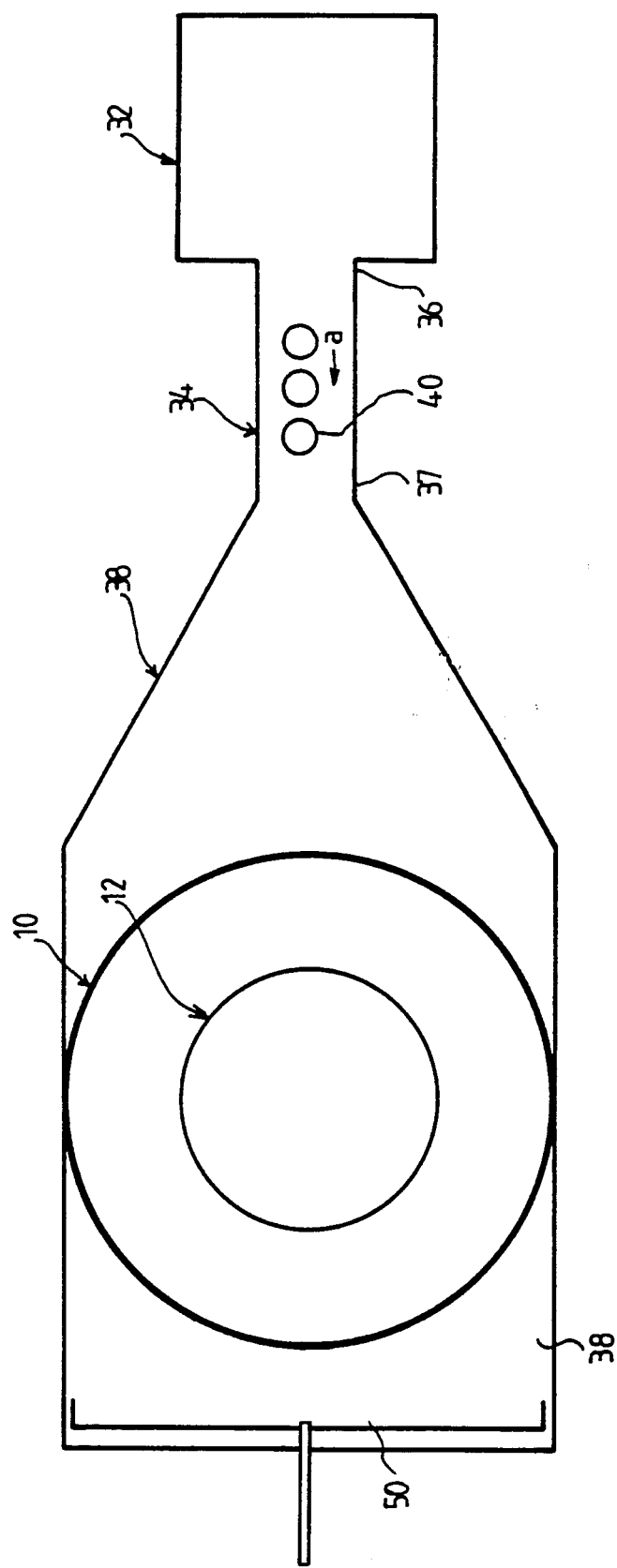
FIG. 2 is a top view of the plasma reactor of FIG. 1.

A plasma reactor (FIGS. 1 and 2) comprises a metallic housing (10) made for example, of copper having a generally cylindrical shell.

The housing 10 comprises an inner cylindrical tube 12, concentric with the housing 10 and whose wall is constituted by a material with low dielectric losses, such as quartz.

The tube 12 has at each of its ends 14 and 16, a circular opening.

The lower portion of the housing 10 is provided with a circular opening 18 concentric with the housing 10 with a diameter substantially equal to that of the opening 16 of the tube 12. The circular openings 16 and 18 are superposed so that the tube 12 communicates with the outside of the housing 10.

The upper portion of the housing 10 is also provided with a circular opening 20 concentric with the housing 10, with a diameter substantially equal to that of the opening 14 of the tube 12. The circular opening 20 is completely covered by a metallic circular cover 22, made of aluminium for example. The cover 22 is pierced at its center by an opening allowing a tube 24 to pass, whose end 26 issues in the tube 12.

Figure 3:
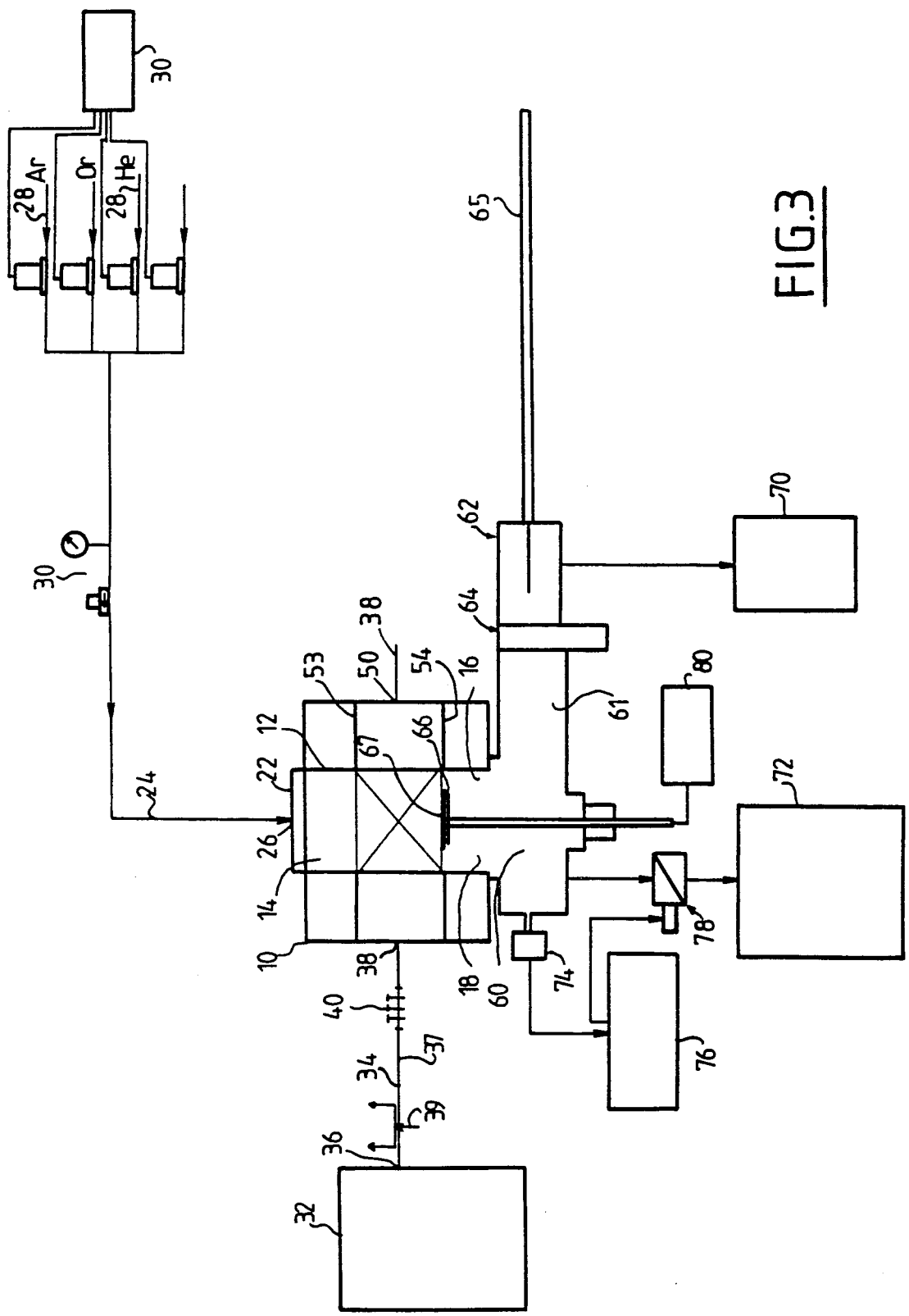
FIG. 3 is a schematic general view of the main means that constitute the plasma reactor in accordance with the invention.

Reference will now be made to FIG. 3. A selected gaseous flow circulates in the tube 24. The tube 24 may be connected by conventional means to bottles 28 containing gases such as argon, oxygen, helium etc. . . .

Control means 30 such as flow meters and flow controllers allow the flow of the gaseous flow in the tube 24 to be controlled, as well as to obtain a selected gas mixture.

Reference is again made to FIGS. 1 and 2. The plasma reactor also comprises a microwave generator 32 capable of operating at a frequency of the order of 2.45 gigahertz and at a power of 1.2 kilowatt.

Wave guide means 34 pass the microwaves to the housing 10 along a non-resonant coupling wherein the housing 10 does not dissipate, in the form of electromagnetic radiation, the ultrahigh frequency energy imparted to it in the said housing 10 in the presence of gas. The initial portion 36 and intermediate portion 37 of the wave guide means have a rectangular cross section. The electromagnetic energy is propagated in this guide in the longitudinal direction of the guide 34 (arrow a), the electric field E being orientated transversely to the direction a.

In the initial portion 36 of the wave guide 34, provision is made for a bidirectional coupler 39. In their intermediate portion 37, the wave guide means comprise a plurality of penetrating adjustment screws 40 (for example, three in number) allowing the impedance of the reactor to be adjusted so as to obtain a good output of the ultrahigh frequency transmission towards the housing 10.

As a variant, the screws 40 may be disposed in the end portion 38 of the wave guide means which will be described below.

According to the main characteristic of the invention, the end portion 38 of the wave guide means is progressively tapered in one direction (the vertical direction), and widened in the other (the horizontal direction) until it attains a flat rectangular cross section completely surrounding the housing 10.

In its intermediate portion, the housing 10 is subdivided into two half housings 11 and 13 separated from each other by a space (gap or clearance) with a rectangular cross section substantially equal to that of the end portion 38 of the wave guide means so as to be completely surrounded by the said end portion 38 of the wave guides. Thus the end portion 38 of the wave guides completely surround the housing 10 in the region of the separation of the two half shells 11 and 13 so as to pass the microwaves to the tube 12.

The rectangular cross section of the end portion 38 of the wave guides is greater than that of the space separating the two half shells 11 and 13. Thus a space (gap or clearance) is arranged which permits a non-resonant coupling of the wave guide to the housing 10.

The original geometrical shape of the end portion of the wave guide, that is to say, tapering in one direction and widening in the other, allows the electromagnetic energy to be evenly distributed over the whole cross section of the housing 10. The result is a much greater excitation zone than that proposed by the conventional cylindrical or rectangular wave guides. Moreover, the end portion 38 is constricted at its end so as to increase the directivity of the incident electromagnetic waves.

In theory, such an end portion of the wave guide should produce waves of a higher mode in the housing, liable to dissipate the ultrahigh frequency energy imparted to the housing via the wave guide.

Now, the applicant has found, surprisingly, that such a plasma reactor comprising a wave guide having a flat rectangular cross section completely surrounding the housing constitutes an absorbent structure wherein the higher mode waves are not generated.

On the diametrically opposite side in relation to the microwave intake 34, provision is made for a non-resonant coupling to the housing also completely surrounded by the end portion of the wave guide 38.

The non-resonant coupling is a piston-type short circuit means 50. The piston 50 comprises a flat, substantially rectangular cross section equal to that of the end portion of the wave guide means 38.

The coupling is non-resonant, because in the presence of plasma in the tube 12, the coupling does not dissipate, in the form of electromagnetic radiation, the ultrahigh frequency energy imparted thereto.

The position of the piston 50 is adjusted so as to define a desired ultrahigh frequency electrical field in the housing 10. It will be observed that the short circuit piston 50 has the same electromagnetic wave distribution characteristics as the end portion of the wave guides 38, which makes it possible to ensure symmetry in the propagation of the waves. The adjustment of the position of the piston 50 allows couplings better than 90% to be obtained. As for the rectangular wave guide means 34 provided with its adjustment screws 40, it allows the coupling to be improved to over 95%.

In the field of industrial applications, the position of the piston 50 is fixed, whilst in the field of experimental applications, the piston 50 is movable.

Within the housing 10, provision is made for a second ultra-high frequency short circuit means 52 coupled to the tube 12. This second short circuit means 52 comprises two annular discs 53 and 54 that are also of the piston type.

The plasma is generated in the tube 12 and can be confined to a greater or lesser extent by means of the two annular discs 53 and 54 whose height is adjustable.

The pistons 53 and 54 are thus interspaced from each other by a predefined and adjustable distance with a view to confining the plasma in the portion of the tube 12 comprised between the two pistons 53 and 54.

In the field of industrial applications, the pistons 53 and 54 are fixed, whilst in the field of experimental applications, the pistons 53 and 54 are movable.

Reference is again made to FIG. 3.

The circular opening 18 of the lower portion of the housing 10 communicates with the outside via another cylindrical opening 60 with a diameter substantially equal to that of the opening 18 and formed in the cover of a metallic box 61, of aluminum for example, whereon the housing 10 is supported. The openings 16, 18 and 60 are superposed, so that the tube 12 should communicate with the inside of the box 61.

The box 65 is of a general rectangular shape, having on one of its lateral faces a lock chamber 62 coupled to a slide type valve, to allow the samples to be inserted into the tube where the plasma is generated.

A sample 67 intended to be treated by the plasma is passed from the outside of the box 61 to a sample carrier 66 by means of a transfer tube 65. The sample carrier 66 is placed inside the box 61 and concentrically with the tube 12. This sample carrier 66 is movable in vertical translation, which allows it to carry the sample 67 outside or in the plasma being generated in the tube 12. In the case of a surface treatment of samples comprising fragile materials such as polymers, it is preferable for the sample to be carried outside the plasma and close thereto.

The tube 12 and the box 61 are evacuated by primary pumping means 70, establishing a weak vacuum and by secondary pumping means establishing a stronger vacuum. The secondary pumping means 72 are ROOTS type pumps having a delivery of the order of 250 cubic meters per hour.

A pressure gauge 74 completes the vacuum appliance. This gauge 74 has an input connected to the box 61 and an output connected to a pressure controller 76. In response to the pressure measured by the gauge 74, the pressure controller 76 actuates a motor (not shown) actuating the opening/closing of a valve 78 connected to the secondary pumping means 72 with a view to controlling their delivery.

Figure 4:
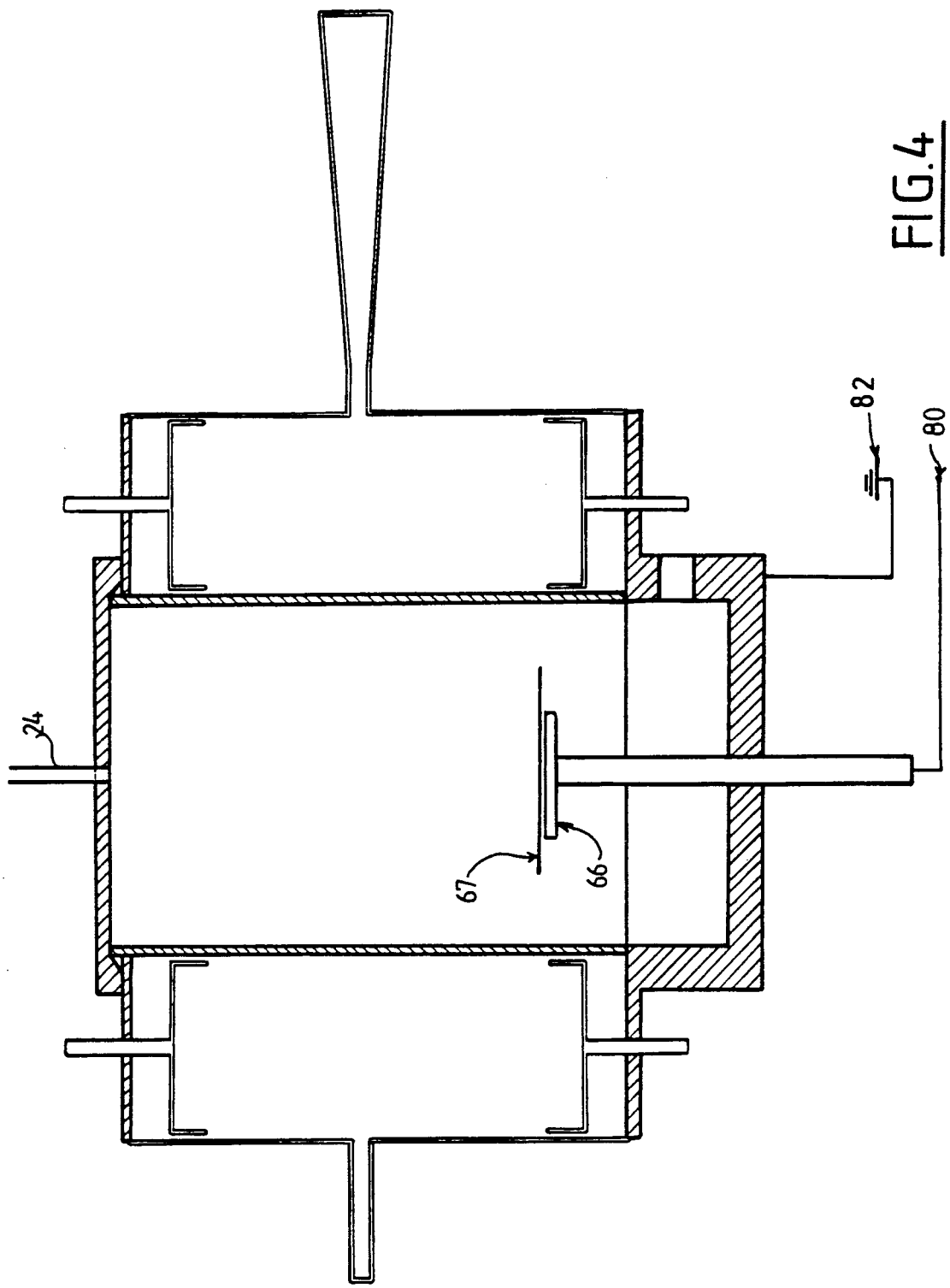
FIG. 4 is a cross sectional view of the plasma reactor in accordance with the invention provided with means for polarizing the sample.

Reference will now be made to FIG. 4. For the treatment of particular surfaces, in particular for the engraving of a silicon oxide layer deposited on a substrate in microelectronics, it has been established that a microwave plasma on its own does not allow a quick engraving of the silicon oxide to be obtained.

In this case, the plasma reactor in accordance with the invention comprises, moreover, generating means 80 capable of superposing an electromagnetic radio frequency field between the means delivering the gaseous flow 24 and the sample carrier 66 with a view to increasing the speed of engraving.

The generating means 80 deliver, for example, an AC voltage with a frequency of the order of 13 megahertz. This AC voltage is applied, for example, to the sample carrier 66, whilst the housing 10 is connected to earth 82.

The applicants have obtained engraving speeds of several thousands of angstroms per minute with an engraving quality of good homogeneity. This result is explained by the fact that the microwave plasma is very rich in positive ions. In fact, these positive ions bombard the negatively polarized sample 67 in the presence of the electromagnetic field generated by the application of the AC voltage to the sample carrier 66.

For surface treatments of samples such as the removal of resin, the applicants have obtained a homogeneous attack on the resin of the order of several microns per minute. The best results as regards the homogeneity of attack were obtained by a substrate placed outside the plasma. The gas used for the resin removal was pure oxygen or an oxygen based mixture.

Sometimes, it is also necessary to heat the sample. In that case, the plasma reactor comprises, moreover, heating means capable of heating the sample. Advantageously, the electromagnetic field generated by application of the AC voltage allows the sample 67 to be heated.

The plasma reactor is operated as follows:
first, the coupling between the piston 50 and the wave guide 34 is adjusted as described above;
then the additional short circuit means 52 is adjusted so as to confine the plasma between the two annular discs 53 and 54 of this short circuit means 52 with the tube 12.

Experiments have then been undertaken with filling pressures for the reactor, variable between 10 milli-torr and $10^4$ milli-torr for the following gaseous configurations: pure oxygen, pure argon and an argon-oxygen mixture, wherein the argon percentage by volume amounted to 66%. The microwave power applied was 800 watts. The adjustment of the short circuit means 50 and of the screws 40 was effected so as to give a minimum reflected power at approximately $10^2$ milli-torr.

As regards pure oxygen, it was then possible to observe that the plasma reactor showed a remarkable stability with a reflected power/total power ratio, also called "TOS", for "Taux d'Ondes Stationnaires"—Rate of Stationary Waves—which did not exceed 2% between 10 milli-torr and 1 torr. In excess of one torr, these "TOS" rates increased very rapidly until the plasma was extinguished.

With pure argon, the "TOS" rates remained low (less than 7%) but nevertheless, clearly higher than with pure oxygen.

With an argon-oxygen mixture, the pressure operating range extended beyond one torr, with "TOS" rates of the order of a few percent. With this argon oxygen mixture, there was again found on the one hand, the wide operating range with argon and on the other hand, a plasma which made it possible to produce high pressure reactive oxygen.

Other tests have been undertaken with the following experimental conditions. The applied microwave power could be varied between 200 and 1200 watts.

It could then be observed that the operation of the plasma reactor remained stable with "TOS" rates of less than 7%, and with virtually perfect adjustment regions. On the other hand, and in conformity with the earlier results, the stability of the reactor is better with pure oxygen than with argon or with an argon-oxygen mixture.

These tests show that the plasma reactors in accordance with the invention have the advantage of a large operating range both as regards pressure and power with low, and even very low "TOS" rates.

Moreover, a very stable plasma can be obtained with relative variations in pressure and/or high power. The conditions for obtaining the plasma are easily reproducible. Other gases, such as ethylene, nitrogen, silicon chloride may be used for the gaseous flow, while retaining the same operating characteristics of the reactor.

The applicants have also observed that the distribution of the electromagnetic field has its maximum near the wall of the tube 12 and its minimum at the center of the said tube. In these conditions, it seems that the ultrahigh frequency waves produced in the gas are essentially surface waves. The plasma which is thus homogeneous in the portion comprised between the annular discs 53 and 54 of the additional short circuit means 52 is then the locus of stationary ultrahigh frequency waves of very high intensity.

The applicants have also observed that the excitation frequency, that is to say, the frequency of the microwave generator affects the electronic density and the volume of the plasma.

They have also observed that when the excitation frequency is reduced, the electronic density is reduced as a corollary, but at the same time, it is possible to increase the volume of the plasma. Thus, for the applications requiring, for example, a plasma of a very great volume and a low electronic density, it is necessary to reduce the excitation frequency and vice versa.

The various tests were made with a plasma reactor whose dimensions are as follows.

The dimensions of the housing 10 were: diameter approximately 400 millimeters, height 300 millimeters.

The dimensions of the tube 12 were: diameter approximately 195 millimeters, height approximately 300 millimeters.

In its intermediate portion 37, the dimensions of the wave guide were 43×86 millimeters in cross section.

The dimensions of the short circuit means 50 were approximately 400×10 millimeters in cross section.

In its end portion, the dimensions of the wave guide were approximately 400×10 millimeters in cross section.

The advantages of the plasma reactor in accordance with the invention are as follows:
- an absence of electrodes;
- an absence of a magnetic diffusion field consuming a large amount of energy;
- a high electronic density in the kinds of gases in question (an electronic density with argon of the order of $10^{12}$ to $10^{13}$ per cubic centimeter).
- a large pressure operating range (from some $10^{-3}$ torr to a few torr);
- a stability and reproducibility of the operating conditions;
- a large cross section and a large volume of the plasma;
- an adjustment of the volume of the plasma by confinement of the electromagnetic field (adjustment of the short circuit means 52);
- an adjustment of the volume of the plasma by the value of the incident power (adjustment of the power output of the generator 32);
- homogeneity of the distribution of the kinds of gases in question;
- a very good ultrahigh frequency non-resonant coupling;
- a stability of the non-resonant coupling for various gas mixtures.

We claim:

1. A plasma reactor comprising: a housing (10) capable of receiving a selected gaseous flow, a microwave generator (32) and wave guide means (34) for passing the microwaves to the housing (10) along a non-resonant coupling wherein the housing (10) does not dissipate, in the form of electromagnetic radiation, the ultrahigh frequency energy imparted thereto in the presence of gas, characterized in that, since the housing (10) is of a large size, the end portion (38) of the wave guide means is progressively reduced in one direction and widened in the other until it reaches a flat rectangular cross section completely surrounding the said housing (10) and produces a non-resonant coupling (50) therewith.

2. A plasma reactor according to claim 1, characterized in that provision is made for a piston type short circuit means (50), completely surrounded by the end portion (38) of the wave guide means and disposed on the diametrically opposite side relative to the microwave intake, said piston (50) being adjusted so as to define a desired ultrahigh frequency electric field in the housing (10).

3. A plasma reactor according to claim 2, characterized in that the short circuit means (50) is immovable.

4. A plasma reactor according to claim 2, characterized in that the short circuit means (50) is movable.

5. A plasma reactor according to claim 2, characterized in that the housing (10) comprises an internal tubular element (12) placed in a vacuum and being concentric with the housing (10), the wall of the said tubular element (12) being constituted by a material having low dielectric losses, such as quartz.

6. A plasma reactor according to claims 5, characterized in that provision is made inside the housing (10) for an additional short circuit means (52) coupled with the tubular element (12) and having first and second annular discs (53, 54) surrounding the tubular element (12), said annular discs (53, 54) being separated from each other by a predetermined and adjustable distance with a view to confining the plasma in the portion of the tubular element (12) comprised between said annular discs (53, 54).

7. A plasma reactor according to claim 6, characterized in that the additional short circuit means (52) is immovable.

8. A plasma reactor according to claim 6, characterized in that the additional short circuit means (52) is movable.

9. A plasma reactor according to claim 1, characterized in that the wave guide comprises in its intermediate portion (37), adjustment means such as a plurality of adjustable penetrating screws (40).

10. A plasma reactor according to claim 1, characterized in that the wave guide comprises in its end portion tapering in one direction and widened in the other, adjustment means such as a plurality of adjustable penetrating screws (40).

11. A plasma reactor intended for a surface treatment of a sample according to claim 6, characterized in that the sample (67) is supported on a sample carrier (66) placed inside the tubular element (12) in the portion comprised between the two annular discs (53, 54) wherein the plasma is formed.

12. A plasma reactor intended for a surface treatment of a sample according to claim 6, characterized in that the sample (67) is supported on a sample carrier (66) placed into the tubular element (12) and outside the portion comprised between the two annular discs (53 and 54) wherein the plasma is formed.

13. A plasma reactor according to claim 11, characterized in that it comprises moreover means (80) for generating an electromagnetic radiofrequency field between means delivering the gaseous flow and the sample carrier (66) with a view to polarizing the sample (67).

14. A plasma reactor according to claim 11, characterized in that it comprises, moreover, heating means for heating the sample.

15. A plasma reactor according to claim 11, characterized in that provision is made for a lock chamber for the insertion of the samples to allow the sample (67) to be placed on the sample carrier (66).

* * * * *